United States Patent [19]

Kikuchi et al.

[11] Patent Number: 4,939,630
[45] Date of Patent: Jul. 3, 1990

[54] ILLUMINATION OPTICAL APPARATUS

[75] Inventors: Tetsuo Kikuchi, Tokyo; Masahiro Nakagawa, Kanagawa; Koichi Matsumoto; Haruo Ozawa, both of Tokyo; Hiroshi Shirasu; Yuji Kudoh, both of Kanagawa, all of Japan

[73] Assignee: Nikon Corporation, Tokyo, Japan

[21] Appl. No.: 237,847

[22] Filed: Aug. 26, 1988

Related U.S. Application Data

[63] Continuation-in-part of Ser. No. 92,886, Sep. 4, 1987, abandoned.

[30] Foreign Application Priority Data

Sep. 9, 1986 [JP] Japan .................. 61-212064
Jan. 29, 1987 [JP] Japan .................. 62-19412
Sep. 22, 1987 [JP] Japan .................. 62-238225

[51] Int. Cl.$^5$ .................. F21V 7/04; G02B 27/00
[52] U.S. Cl. .................. 362/268; 350/167; 355/67
[58] Field of Search .............. 350/167, 169, 523, 507; 362/268; 355/67; 353/122, 38, 85

[56] References Cited

U.S. PATENT DOCUMENTS

| 3,501,626 | 3/1970 | Benard ........................... 362/268 |
| 3,941,475 | 3/1976 | Sheets ............................ 350/167 |
| 3,988,066 | 10/1976 | Suzuki et al. ................... 350/167 |
| 4,497,013 | 1/1985 | Ohta ............................... 362/268 |
| 4,497,015 | 1/1985 | Konno et al. ................... 350/167 |
| 4,619,508 | 10/1986 | Shibuya et al. ................ 362/268 |
| 4,682,885 | 7/1987 | Torigoe ........................... 350/167 |
| 4,683,524 | 7/1987 | Ohta ............................... 362/268 |
| 4,717,242 | 1/1988 | Echizen et al. ................. 362/268 |
| 4,769,750 | 9/1988 | Matsumoto et al. ........... 362/268 |
| 4,789,222 | 12/1988 | Ota et al. ........................ 350/167 |

FOREIGN PATENT DOCUMENTS

| 2803277 | 8/1979 | Fed. Rep. of Germany ...... 350/167 |
| 56-81813 | 7/1981 | Japan . |
| 59-160734 | 9/1984 | Japan ................................. 350/167 |

Primary Examiner—Jon W. Henry
Attorney, Agent, or Firm—Shapiro and Shapiro

[57] ABSTRACT

An illumination optical apparatus includes secondary light source forming means for forming a plurality of light source images from collimated light beams emitted from a light source, tertiary light source forming means arranged midway along an optical path from the secondary light source forming means, and a condenser lens arranged midway along an optical path from the tertiary light source forming means. The secondary light source forming means includes an optical integrator having entrance and exit surface. A plurality lens surface having a larger focal length than a distance between the entrance and exit surfaces are formed on the entrance sarfaces. Thus, a plurality of secondary light source images are formed by the secondary light source forming means in a space behind the exit surface of the optical integrator.

14 Claims, 4 Drawing Sheets

ILLUMINATION OPTICAL APPARATUS

CROSS REFERENCE TO RELATED APPLICATION

This is a continuation-in-part of application Ser. No. 92,886 filed Sept. 4, 1987, now abandoned.

BACKGROUND OF THE INVENTION

1. Field of the Invention

The present invention relates to an illumination optical apparatus for uniformly illuminating an object using a collimated light source such as laser and, more particularly, to an illumination optical apparatus suitable for an exposure apparatus used for manufacturing a semiconductor element such as an IC.

2. Related Background Art

Example of a conventional illumination apparatus suitable for use in an exposure apparatus for manufacturing a semiconductor element such as an IC include: an apparatus adopting an elliptic mirror and a single optical integrator as described in Japanese Laid-open Patent Application No. 81813/1981, and an apparatus using two serially arranged optical integrators for improving uniformity of illumination as described in U.S. Pat. No. 4,497,015. However, in these illumination optical apparatus, an ultra high-pressure mercury lamp is used as a light source. For this reason, the light emission characteristic in the short wavelength range is insufficient, and only a small amount of light can be obtained. Thus, it is proposed that a laser be used as a high-output light source for a short wavelength range instead of the ultra high-pressure mercury lamp. An apparatus incorporating a laser light source is described in U.S. Pat. No. 4,619,508.

However, when an excimer laser or a YAG laser is used as a light source, the laser power is very strong, and a focal point becomes a very small spot. For this reason, a spot with a very high energy density is formed, and lens may occur due to reflection inside the. Also, ghost light may appear on an object to be illuminated. In particular, if a focal point is formed at an edge of an aperture stop arranged in an illumination optical system, strong scattered light is generated therefrom as flare. Therefore, it is difficult to maintain a uniform illuminance at the object. In addition, lens damage may be caused by the flare.

SUMMARY OF THE INVENTION

It is an object of the present invention to provide an illumination optical apparatus comprising an optical arrangement that can prevent an optical element from being damaged due to the influence of a light source for generating collimated light beams with high energy.

It is another object of the present invention to provide an illumination optical apparatus wherein generation of ghost light or flare is suppressed to improve uniformity of illuminance on an object.

The apparatus of the present invention includes secondary light source forming means for forming a plurality of light source images from collimated light beams emitted from a light source, tertiary light source forming means arranged midway along an optical path from the secondary light source forming means, and a condenser lens arranged midway along an optical path from the tertiary light source forming means. The secondary light source forming means includes an optical integrator having entrance and exit surfaces. A plurality of lens surfaces having a larger focal length than a distance between the entrance and exit surfaces are formed on the entrance surface. Thus, a plurality of secondary light source images are formed by the secondary light source forming means in a space behind the exit surface of the optical integrator. With this arrangement, the position at which light beams emitted from the light source are first focused is located in a space outside the optical integrator. Therefore, even when the light intensity of collimated light is extremely strong, the element cannot be damaged by heat at the focal point. Upon combination with the tertiary light source forming means arranged in series with the secondary light source forming means, a large number of point sources are formed on the exit surface of the tertiary light source forming means, and a uniform large surface illuminant is formed. Therefore, an object can be efficiently and uniformly illuminated.

In a preferred embodiment of the present invention, aperture stop means is provided adjacent to an image plane having the secondary light source images, and a condenser lens for focusing illumination light beams onto the object is provided behind the aperture stop means. The shape and size of an edge forming the aperture of the aperture stop are determined so as not to coincide with any of the plurality of secondary light source images.

DETAILED DESCRIPTION OF THE PREFERRED EMBODIMENTS

Figure 1:
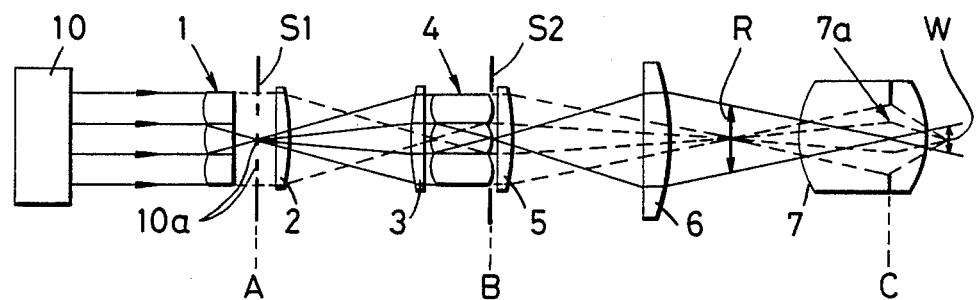
FIG. 1 is an exploded optical path diagram showing a schematic arrangement of a projection exposure apparatus according to an embodiment of the present invention.

Referring to FIG. 1, light beams emitted from a laser light source 10 are substantially collimated, and a plurality of secondary light source images 10a are formed by a first optical integrator 1 on a plane A in an a space adjacent to the exit side of the integrator. The light beams from the secondary light source images 10a are converted to parallel light beams by an input lens 3 through a positive lens 2, and are then incident on a second optical integrator 4.

Figure 2A:
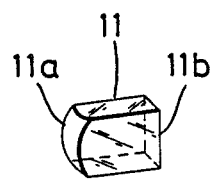
FIG. 2A is a perspective view of a rod-like element constituting a first optical integrator shown in FIG. 1.

The first optical integrator 1 is constituted by a bundle of columnar rod-like elements 11 which are square in transverse cross section, one such element being shown in FIG. 2A. An entrance surface 11a of each rod-like element 11 is formed a convex spherical lens surface. A focal point of the light beams is formed by the convex spherical surface of each rod-like element 11 at a position separated from the exit surface 11b of the rod-like element 11, and this point serves as a secondary light source. In this embodiment, since the laser light source is used, a light source image has substantially no size, and hence, a lens effect like a so-called field lens is not required at the exit side of the first optical integrator 1. Therefore, the exit surface 11b of each rod-like element 11 is formed into a flat surface. With the above structure of the first optical integrator 1, the secondary light sources corresponding in number to the rod-like elements 11 are formed on the plane A in the exit side space. The positive lens 2 is arranged to be separated from the plane A so as not to contain from a focusing position with a high energy density.

Figure 3A:
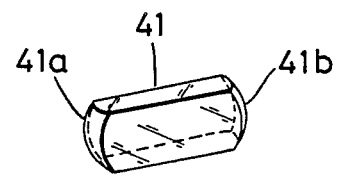
FIG. 3A is a perspective view of a rod-like element constituting a second optical integrator shown in FIG. 1.
Figure 2B:
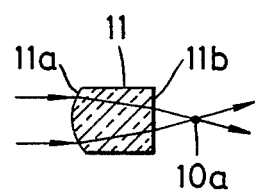
FIG. 2B is a sectional view of FIG. 2A.
Figure 3B:
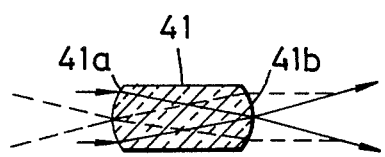
FIG. 3B is a sectional view of FIG. 3A.

A second optical integrator 4 is constituted by a bundle of columnar rod-like elements 41 which are also square in transverse cross section, one element 41 being shown in FIG. 3A. Entrance and exit surfaces 41a and 41b of each element 41 are formed as convex lens surfaces. As shown in FIG. 3B, the focal points of both the lens surfaces are located on the opposing surfaces of the rod-like element. More specifically, light beams incident parallel to an optical path to the entrance surface 41a are focused on the exit surface 41b, and light beams incident in the focused state on the entrance surface 41a are converted to parallel light beams after as they are output from the exit surface 41b. The plane A on which the secondary light sources are formed and a plane B at the exit surface of the second optical integrator are conjugate with respect to the positive lens 2, the input lens 3, and the entrance surfaces 41a of the second optical integrator 4. Therefore, tertiary light sources corresponding in number to a product of the number of the rod-like elements constituting the first optical integrator and the number of the rod-like elements 41 constituting the second optical integrator 4 are formed on the exit surface B of the second optical integrator 4, and a substantially uniform surface illuminant is formed.

Note that the focal length of the positive lens 2 arranged at the exit side of the first optical integrator 1 is set to be substantially equal to the distance between the positive lens 2 and the entrance surface of the second optical integrator 4. The focal point of the input lens 3 at the side of the secondary light sources substantially coincides with the plane A on which the secondary light sources are formed. Therefore, the input lens 3 converts the light beams from the secondary light sources into parallel beams.

The light beams from the tertiary light sources on the exit surface B are converged by a condenser lens 6 through an output lens 5, and are superposed on a reticle R. Then, a predetermined pattern on the reticle R is transferred onto a semiconductor wafer W by a projection objective lens 7. At this time, tertiary light source images formed on the exit surface of the second optical integrator 4 are again focused on an entrance pupil 7a of the projection objective lens 7, Thus achieving so-called Köhler illumination. Note that the output lens 5 serves as a field lens in the same manner as the convex surfaces on the exit surface side of the second optical integrator 4. Therefore, the lens 5 is not always necessary, and may be omitted.

In this embodiment, a first aperture stop $S_1$ having a variable diameter is provided on the plane A in the exit side space of the first optical integrator 1, and a second aperture stop $S_2$ having a variable diameter is provided at the exit surface B of the second optical integrator 4. By changing the diameter of the first aperture stop $S_1$, an amount of light reaching an object to be illuminated can be controlled while maintaining a $\sigma$ value constant. By changing the diameter of the second aperture stop $S_2$, the $\sigma$ value can be controlled. The $\sigma$ value is defined as a ratio of an N.A. (numerical aperture) of an illumination optical system to that of a projection objective lens, and a balance between the resolution and contrast of the projection objective lens can be adjusted by this value. By the combination of the two aperture stops $S_1$ and $S_2$, an amount of light and the $\sigma$ value can be independently controlled. Therefore, an optimal illumination state can be realized in accordance with a change in amount of light emitted from the light source, a density of a projection pattern of the reticle R, a characteristic of a resist applied onto the wafer, and the like.

Figure 4:
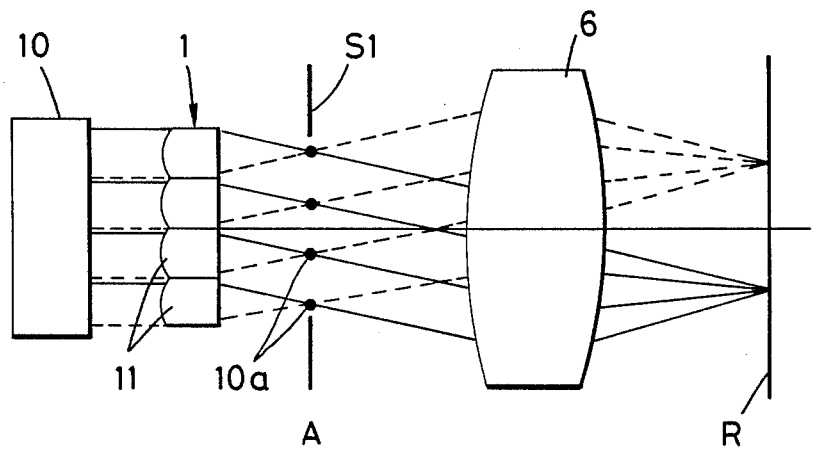
FIG. 4 is an exploded optical path diagram partially showing the arrangement of FIG. 1.

The first aperture stop $S_1$ will now be described with reference to FIG. 4. A plurality of focal points corresponding in number to the rod-like elements of the first optical integrator 1 are formed on the plane A. However, if one or some of focal points are formed to coincide with the edge of the aperture stop $S_1$ or a stop member adjacent thereto, flare caused by scattered light reflected by the edge or the stop member is generated. In addition, since the energy density of the light beams is high at the focal points, the aperture stop may be damaged.

Figure 5:
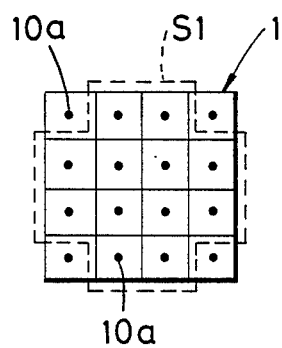
FIG. 5 is a plan view showing a shape of a first aperture stop shown in FIG. 1.

In order to prevent this, the edge of the first aperture stop $S_1$ has a shape and an arrangement so as not to coincide with any focal point. With the specific shape of the aperture stop $S_1$ as shown in FIG. 5, four corners of a rectangle are notched along sectional shapes of the rod-like elements 11, so that the edge of the stop does not coincide with the focal points.

As a normal method for achieving a variable stop diameter, the stop can be replaced with a stop member having a shape similar thereto, thereby allowing a variable stop diameter. Instead of replacing the aperture stop $S_1$, the diameter of the aperture stop itself may be variable.

Note that the first optical integrator 1 is constituted by a plano-convex lens group in which the convex spherical surface is directed toward the light source. However, the present invention is not limited to this. For example, the exit surface may have a lens effect. In addition, the surface at the side of the light source may be formed into a flat surface, and the convex spherical surface may be provided on the exit surface.

Each optical integrator may also be constituted by a plurality of rod-like elements having a hexagonal section.

Note that in a system in which a large number of focal points are formed in accordance with the present invention, as a further safeguard against damage to the aperture stop, the aperture stop may be arranged at a position at which the large number of focal points are slightly defocused.

Figure 6:
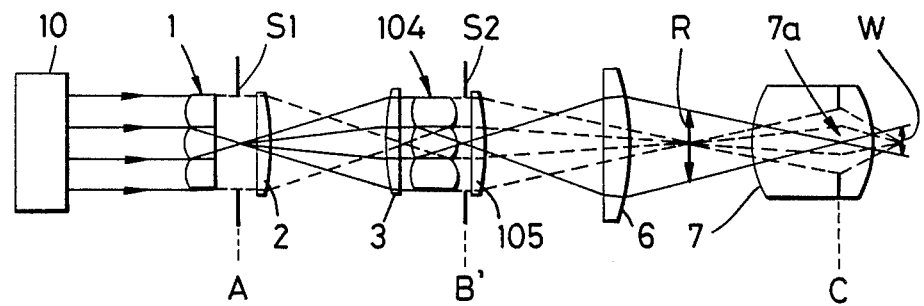
FIG. 6 is an exploded optical path diagram showing a schematic arrangement of a projection exposure apparatus according to another embodiment of the present invention.

FIG. 6 shows another embodiment wherein tertiary light sources formed with the second optical integrator are positioned in a space behind the exit surface of the optical integrator, thus also preventing the rod-like elements constituting the second optical integrator from being damaged by heat energy produced at focal points. Collimated light beams emitted from a laser light source 10 similar to that shown in FIG. 1 are directed by first optical integrator 1 to a plurality of focal points on plane A in a space adjacent to the exit side of the integrator. The light beams from the plural focal points are collimated through a positive lens 3 and are then incident on a second optical integrator 104.

Figure 7:
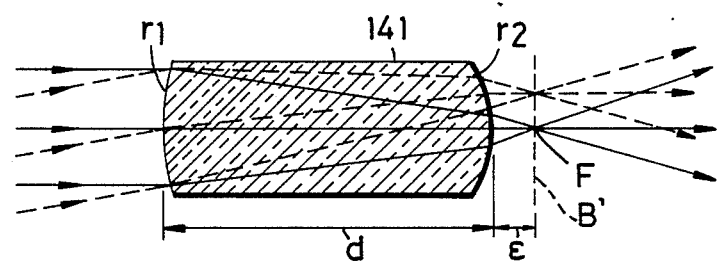
FIG. 7 is a sectional view of one of the lens elements constituting the second optical integrator shown in FIG. 6.

The structure of each of the lens elements constituting the second optical integrator 104 will now be described with reference to FIG. 7.

The back focus $bf_1$ at the exit side of each of the lens elements 141 constituting the second optical integrator is a distance between a vertex of the second surface of the lens element and the focus F at the image side. The back focus $bf_2$ at the entrance side is a distance between a vertex of the first surface of the lens element and the focus at the object side. These distances may be defined as follows:

$$bf_1 = \left(1 - \frac{n-1}{n} \cdot \frac{d}{r1}\right) \cdot f \quad (1)$$

$$bf_2 = \left(1 + \frac{n-1}{n} \cdot \frac{d}{r2}\right) \cdot f, \quad (2)$$

wherein r1 represents the radius of curvature of the first surface of the lens element 141, r2 represents the radius of curvature of the second surface, d the axial thickness, n the refractive index and f the focal distance.

In equation (1), if $bf_1$ is equal to a definite, positive value ε (epsilon), then the focal point of each of the lens elements in the optical integrator can be positioned in the air space outside the lens element.

Also, if the vertex of the first surface of each of the lens elements is made to be substantially coincident with the focus of the second surface at the entrance side, a telecentric system can be made at the exit side of the optical integrator, thus preventing vignetting at an optical element such as a condenser lens succeeding the optical integrator to make the structure small-sized and to increase efficiency of illumination. In this case, it is necessary that $bf_2$ is equal to zero in the equation (2).

From the equations (1) and (2), each of r1 and r2 may be given below:

$$r1 = \frac{n-1}{n} \cdot d / \left(1 - \frac{bf_1}{f}\right)$$

$$r2 = -\frac{n-1}{n} \cdot d$$

Given this result, in order to make a telecentric system at the exit side of the optical integrator, it becomes necessary that the absolute values of radii of curvature r1, r2, satisfy the condition $|r1| > |r2|$.

The foregoing can be summarized in the following:
(i) a lens surface r1 having a positive refractive power is formed on the entrance surface and a lens surface r2 having a positive refractive power is also formed on the exit surface;
(ii) the refractive power of the lens surface at the exit side is larger than the refractive power of the lens surface at the entrance side ($|r1| > |r2|$); and
(iii) the focus F at the image side is located behind the lens surface at the exit side.

Since the lens element 141 satisfies these conditions, light beams collimated through the positive lens 3 are incident on the second optical integrator 104 and one light source image is formed for each of lens elements at a position spaced away from the exit surface of the integrator by ε. As a result, tertiary light source images corresponding in number to the lens elements constituting the second optical integrator are formed on a plane B, spaced away from the exit surface of the second optical integrator 104 by ε.

Note that each of the tertiary light source images thus formed is an image of a substantially surface illuminant consisting of a plurality of focal points through the first optical integrator 1. And light beams from the tertiary light source images are converged through an output lens 105 by a condenser lens 6, and are superposed on a reticle R.

In each of the above-described embodiments, the light source 10 preferably comprises a beam shaping optical system for shaping the laser beam into a substantially isotropic beam having a predetermined width, and a beam expander optical system.

The application of the present invention is not limited to the case where light beams from a light source are steadily radiated on an object surface such as a reticle R as shown in the above embodiment.

The present invention can be applied in like fashion to an illuminating device designed to scan an object surface, for example, as disclosed in U.S. Pat. No. 4,619,508.

Figure 8:
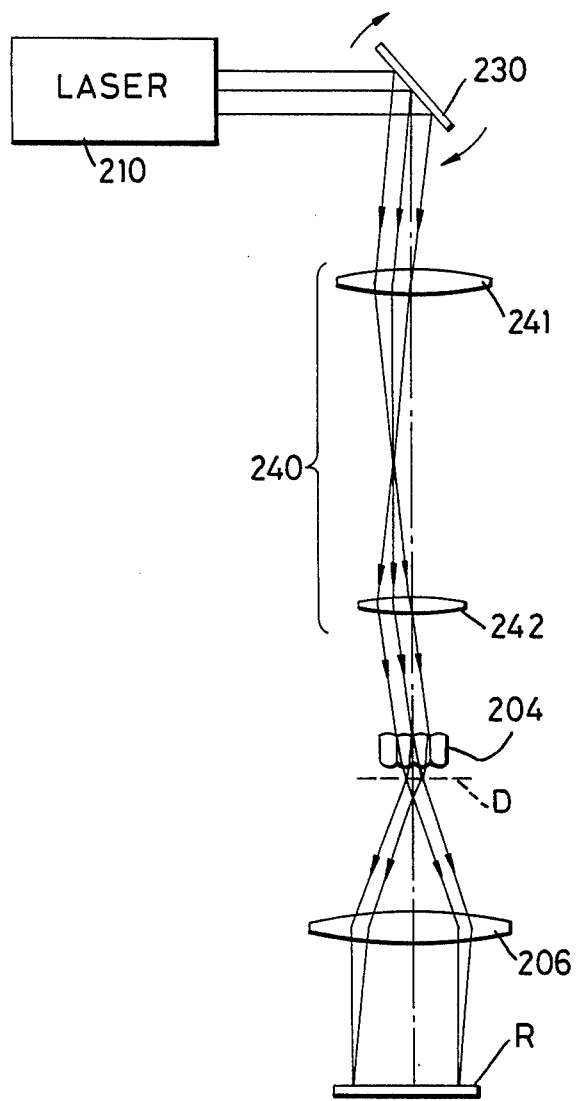
FIG. 8 is an optical path diagram showing a schematic arrangement of an illuminating optical device according to another embodiment of the present invention.

FIG. 8 shows an embodiment wherein light beams are scanned on the object surface. With this structure it is possible to remove illumination non-uniformity such as speckle patterns because of the coherency of laser beams.

Laser beams emitted from a light source 210 are scanned angularly at a rotating mirror 230 and are incident on an afocal converter 240 consisting of two positive lenses 241 and 242. Parallel beams emitted from the converter 240 are incident on an optical integrator 204 consisting of a plurality of lens elements each of which has the shape shown in FIG. 7.

Note that the afocal converter 240 is used to enlarge or reduce the width of laser beam under a desired magnifying power and that the rotating mirror 230 and an entrance surface of the optical integrator 204 are arranged to be substantially conjugate with each other with respect to the afocal converter. With this structure angles of parallel beams incident on the entrance surface of the optical integrator 204 vary continuously within predetermined ranges as the rotating mirror 230 rotates, and a plurality of focal points are formed on a plane D in a space outside the optical integrator 204 and each of them moves continuously in the plane D. In this way, a substantial surface illuminant is formed on the plane D. Light beams emitted from the substantial surface illuminant pass through a condenser lens 206 onto the reticle R.

While the invention has been described herein with reference to several preferred embodiments, it will be apparent to those skilled in the art that various changes may be made in keeping with the basic principles of the invention, the scope of the invention being defined in the appended claims.

What is claimed is:

1. An illumination optical apparatus comprising:
   light source means for emitting collimated light beams;
   first integrator means for forming a plurality of secondary light sources on a predetermined focal plane from the light beams from said light source means, said first integrator means having an entrance surface including a plurality of convex lens surfaces and an exit surface formed by a flat surface substantially perpendicular to an optical axis, each of said convex lens surfaces having a longer focal length than a distance between the entrance and exit surfaces;
   second integrator means for forming a plurality of tertiary light sources from each of the plurality of second light sources formed by said first integrator means; and
   means for superposing the light beams from the tertiary light sources.

2. An apparatus according to claim 1, wherein said focal plane is located in a space between said first and second integrator means.

3. An apparatus according to claim 1, further including aperture stop means arranged at or near said focal plane and having an adjustable aperture size, said aperture stop means having aperture-stop defining edge means shaped for adjustment into stopped down states in which said edge means is not in substantial coincidence with any of the plurality of secondary light sources.

4. An apparatus according to claim 1, wherein said second integrator means includes a plurality of optical components arranged parallel to an optical axis.

5. An apparatus according to claim 4, further comprising optical means arranged between said first integrator means and said second integrator means for causing light beams from each of the plurality of secondary light sources to be incident on the plurality of optical components of said second integrator means.

6. An illumination optical apparatus comprising:
   light source means for emitting collimated light beams;
   first integrator means, including a plurality of optical components arranged parallel to an optical axis, for forming secondary light sources on a first plane from the light beams from said light source means;
   second integrator means, including a plurality of optical components arranged parallel to the optical axis, for forming tertiary light sources on a second plane from the secondary light sources, each of said optical components of said second integrator means forming a plurality of tertiary light sources corresponding to the number of secondary light sources formed on said first plane;
   means for superposing the light beams from the tertiary light sources on an object;
   first aperture stop means, arranged at or near said first plane and having an adjustable aperture size, for varying said number of secondary light sources and controlling an intensity of light illuminating the object independently of a sigma value of the illumination optical apparatus; and
   second aperture stop means, arranged at or near said second plane and having an adjustable aperture size, for controlling the sigma value.

7. An apparatus according to claim 6, further comprising optical means arranged between said first integrator means and said second integrator means for causing the light beams for each of the secondary light sources formed on said first plane to be incident on all of the plurality of optical components of said second integrator means.

8. An apparatus according to claim 6, wherein said first integrator means includes an entrance surface having a plurality of convex lens surfaces and an exit surface formed by a flat surface substantially perpendicular to said optical axis, and each of said convex lens surfaces has a longer focal length than a distance between the entrance and exit surfaces.

9. An illumination optical apparatus comprising:
   light source means for emitting collimated light beams;
   optical integrator means, including a plurality of optical components arranged parallel to an optical axis, for forming a plurality of images of said light source means on a plane from the light beams from said light source means;
   each of said optical components including an entrance lens surface having a first positive refracting power and an exit lens surface having a second positive refracting power larger than said first positive refracting power, and said each optical component having a focal point at an image plane spaced by a predetermined distance from said exit lens surface; and
   means for superposing light beams from said optical integrator means on an object.

10. An apparatus according to claim 9, wherein said entrance lens surface has a radius of curvature larger than a radius of curvature of said exit lens surface.

11. An apparatus according to claim 9, wherein said focal point of each optical component is located in a space between said optical integrator means and said superposing means.

12. An apparatus according to claim 9, wherein said exit lens surface has an object focal point substantially coincident with a vertex of said entrance lens surface.

13. An apparatus according to claim 9, wherein said light source means includes means for forming a surface light source and positive lens means for forming the collimated light beams from said surface light source.

14. An illumination optical apparatus comprising:
   light source means for emitting collimated light beams;
   first integrator means, including a plurality of optical components arranged parallel to an optical axis, for forming secondary light sources on a first plane from the light beams from said light source means;
   second integrator means, including a plurality of optical components arranged parallel to the optical axis, for forming a plurality of tertiary light sources on a second plane from each secondary light source, each of said optical components of said second integrator means being disposed to receive light from all of said secondary light sources and forming tertiary light sources corresponding to the secondary light sources from which light is received;
   means for superposing the light beams from the tertiary light sources on an object;
   first aperture stop means, arranged at or near said first plane and having an adjustable aperture size, for controlling an intensity of light of each of said tertiary light sources independently of a sigma value of the illumination optical apparatus by varying the number of secondary light sources from which light is received by said optical components of said second integrator means; and second aperture stop means, arranged at or near said second plane and having an adjustable aperture size, for controlling the sigma value.

* * * * *